(12) United States Patent
Kim et al.

(10) Patent No.: US 9,359,683 B2
(45) Date of Patent: Jun. 7, 2016

(54) METHOD OF FORMING METAL AND METAL ALLOY FEATURES

(75) Inventors: Bioh Kim, Milford, CT (US); Marvin Bernt, Kalispell, MT (US); Greg Wilson, Kalispell, MT (US); Paul R. McHugh, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 804 days.

(21) Appl. No.: 11/840,748

(22) Filed: Aug. 17, 2007

(65) Prior Publication Data

US 2008/0067072 A1 Mar. 20, 2008

Related U.S. Application Data

(63) Continuation-in-part of application No. 11/507,066, filed on Aug. 18, 2006, now abandoned.

(51) Int. Cl.
| | |
|---|---|
| *C25D 5/02* | (2006.01) |
| *C25D 5/18* | (2006.01) |
| *C25D 3/56* | (2006.01) |

(Continued)

(52) U.S. Cl.
CPC .. *C25D 5/02* (2013.01); *C25D 5/18* (2013.01); *C25D 21/10* (2013.01); *C25D 3/56* (2013.01); *H01L 24/11* (2013.01); *H01L 2924/01078* (2013.01); *H01L 2924/01079* (2013.01); *H01L 2924/01322* (2013.01); *H01L 2924/01327* (2013.01); *H01L 2924/3025* (2013.01)

(58) Field of Classification Search
CPC .............. C25D 5/02; C25D 5/18; C25D 3/56; C25D 21/10; H01L 24/11; H01L 2924/01078; H01L 2924/07079; H01L 2924/3025; H01L 2924/01327; H01L 2924/01322
USPC .................................. 205/104, 108, 119, 170
See application file for complete search history.

(56) References Cited

U.S. PATENT DOCUMENTS

| | | | | |
|---|---|---|---|---|
| 3,480,522 A | * | 11/1969 | Brownlow | .................... 205/104 |
| 6,120,641 A | * | 9/2000 | Stevens et al. | ............ 156/345.22 |
| 6,140,241 A | * | 10/2000 | Shue et al. | .................... 438/692 |

(Continued)

FOREIGN PATENT DOCUMENTS

| | | |
|---|---|---|
| CH | 668 431 A5 | 12/1988 |
| JP | 01304753 A * | 12/1989 |

OTHER PUBLICATIONS

Lowenheim (Electroplating, McGraw-Hill Book Co., New York, 1978, pp. 12-13).*

(Continued)

*Primary Examiner* — Luan Van
*Assistant Examiner* — Louis Rufo
(74) *Attorney, Agent, or Firm* — Christensen O'Connor Johnson Kindness PLLC

(57) ABSTRACT

Electric potential, current density, agitation, and deposition rate are controlled to deposit metal alloys, such as tin based solder alloys or magnetic alloys, with minimal variations in the weight ratios of alloying metals at different locations within the deposited metal alloy feature. Alternative embodiments include processes that form metal alloy features wherein the variation in weight ratio of alloying metals within the feature is not necessarily minimized, but is controlled to provide a desired variation. In addition to metal alloys, alternative embodiments include processes for improving the deposition of single metal features.

46 Claims, 7 Drawing Sheets

(51) Int. Cl.
 *C25D 21/10* (2006.01)
 *H01L 23/00* (2006.01)

(56) References Cited

U.S. PATENT DOCUMENTS

| | | | |
|---|---|---|---|
| 6,297,155 B1* | 10/2001 | Simpson et al. | 438/687 |
| 6,344,124 B1* | 2/2002 | Bhatnagar | 205/96 |
| 6,355,153 B1* | 3/2002 | Uzoh et al. | 205/87 |
| 6,610,596 B1* | 8/2003 | Lee et al. | 438/653 |
| 7,194,798 B2* | 3/2007 | Bonhote et al. | 29/603.25 |
| 7,569,131 B2* | 8/2009 | Hixon-Goldsmith et al. | 205/102 |
| 2003/0057099 A1* | 3/2003 | Guldi et al. | 205/291 |
| 2004/0245083 A1 | 12/2004 | Sambar | |
| 2004/0245094 A1 | 12/2004 | McHugh | |
| 2005/0167275 A1* | 8/2005 | Keigler et al. | 205/96 |
| 2005/0227479 A1* | 10/2005 | Feng et al. | 438/637 |
| 2005/0245083 A1 | 11/2005 | Chen | |
| 2006/0070885 A1 | 4/2006 | Uzoh | |
| 2006/0213778 A1* | 9/2006 | Cheng | C25D 5/02 205/105 |
| 2007/0202686 A1* | 8/2007 | Dixit | C25D 7/04 438/625 |

OTHER PUBLICATIONS

Kim, B., and T. Ritzdorf, "Electrochemically Deposited Tin-Silver-Copper Ternary Solder Alloys," Journal of the Electrochemical Society 150(2):C53-C60, 2003.

Kim, B., and T. Ritzdorf, "Electrodeposition of Near-Eutectic SnAg Solders for Wafer-Level Packaging," Journal of the Electrochemical Society 150(9):C577-0584, 2003.

International Preliminary Examination Report dated Feb. 24, 2009, issued in corresponding International Application No. PCT/US07/76215, filed Aug. 17, 2007.

Taiwanese Search Report received Mar. 21, 2013, issued in counterpart Taiwanese Application No. 096130449, filed Aug. 17, 2007, 2 pages.

* cited by examiner

METHOD OF FORMING METAL AND METAL ALLOY FEATURES

CROSS-REFERENCE TO RELATED APPLICATION

This application is a continuation-in-part of copending U.S. patent application Ser. No. 11/507,066, filed on Aug. 18, 2006, the disclosure of which is hereby expressly incorporated by reference.

BACKGROUND

The subject matter described herein relates to methods and systems for forming metal alloy features on microfeature workpieces and controlling composition gradients within the deposited metal alloy features.

Metal alloys are utilized in numerous applications in the microelectronic industry. For instance, Permalloy and other magnetic alloys (which are based on nickel, cobalt and iron) are used in giant magnoresistive heads and magnoresistive heads. Metal alloys are also used as conductive features for interconnects and vias. Noble metal alloys are used as electrodes for capacitors. Other metal alloys, such as lead-tin alloys and lead-free alloys are used as solders for mounting microelectronic devices to substrates.

When metal ions in an electroplating solution have similar reduction potentials, the weight ratio of the metals deposited as an alloy tend to be similar to the ratio of concentrations of the metal ions in the electroplating solution. This characteristic lends itself to predictability and control of the deposited alloy composition within the deposited feature. In contrast, when the alloying metals do not have similar reduction potentials, prediction and control of the alloy composition within the deposited feature becomes more challenging.

Lead-free solders and Permalloy are formed from alloying metals that have substantially different reduction potentials. In addition, the baths used to electroplate lead-free solders and Permalloy include the alloying metals in much different compositions. For example, for tin-silver solders, the silver concentration in the electroplating bath is much less than the tin concentration. In electroplating baths from which Permalloys are deposited, the non-nickel metal ion concentration is generally much less than the concentration of nickel ions. These factors can contribute to variations in the ratio of metals at different locations within the deposited alloys. Such variations can be undesirable for several reasons.

Near-eutectic tin alloy based solders are desirable due to properties such as good melting, solderability, ability to cope with lead contamination and reliability. To use these alloys as general purpose solders, the silver and copper contents are limited to near eutectic compositions on account of melting point limitations for bumping applications. If the weight ratio of metals at different locations within the formed feature varies too far from the ratio needed to provide an alloy with the desired melting properties, incomplete reflow may result at those locations and some of the solder alloy may not melt at the reflow temperature. Simply elevating the reflow temperature is often not a solution because higher temperatures may damage surrounding architecture. Incomplete reflow is undesirable because it can adversely affect conductivity properties of the alloy and integrity of intermetallic interfaces.

In magnetic head applications, variations in magnetic properties of a magnetic head are undesirable because of their impact on performance of the head. The magnetic properties of Permalloy are affected by the composition of the alloy. If portions of the deposited Permalloy differ in composition from other portions, performance of the magnetic head may be adversely affected.

In some applications it may be desirable to produce metal alloy features where portions of the alloy feature differ in composition from other portions of the alloy feature. For example, when an alloy feature interfaces with two dissimilar materials, it may be desirable for a portion of the alloy feature to have one composition at the interface with one material and a different composition at the interface with another material.

SUMMARY

In one aspect, the processes and systems described herein provide techniques and tools that can be used to minimize variations in composition within a formed metal alloy feature. Minimizing variations in composition within formed metal alloy features will reduce the likelihood that alloy features will not function in the manner they were designed to function. For example, minimizing compositional variations in solder alloys can reduce the likelihood that incomplete reflow will occur at desired reflow temperatures or that surrounding architecture will be damaged by increasing the reflow temperature to achieve complete solder reflow. For alloys used for magnetic head applications, minimizing compositional variations in the alloy can reduce the likelihood that the magnetic head will not perform as desired.

One method described below in more detail for forming a metal alloy feature includes a step of providing a microfeature workpiece that includes a metal feature within a recess. The microfeature workpiece is contacted with an electroplating bath that is also in contact with an electrode. Applying an electric potential between the metal feature and the electrode produces a first current density that promotes deposition of a metal alloy having a first weight ratio of alloying metals within the recessed feature. The electric potential is then adjusted to change the first current density to a second current density which results in deposition of a metal alloy having a second weight ratio of alloying metals within the recessed feature. The electric potential is then changed a third time to provide a third current density that results in deposition of a metal alloy having a third weight ratio of alloying metals within the recessed feature. As described below in more detail, in some embodiments, the first, second, and third current densities are different and in other embodiments, the first, second, and third current densities are similar. In addition, as described below in more detail, the resulting first weight ratio of alloying metals, second weight ratio of alloying metals, and third weight ratio of alloying metals in the deposited metal alloy can be substantially the same or can be substantially different.

Methods described herein can be used to form metal alloy features wherein the weight ratio of alloying metals within the deposited metal alloy feature is different at different locations within the deposited feature or form metal alloy features wherein the variance in the weight ratio of alloying metals within the formed metal alloy feature is minimized. A method for producing metal alloy features wherein variation of the weight ratio of alloying metals throughout the deposited metal alloy feature is minimized includes the step of providing a microfeature workpiece that includes a metal feature within a recess. The microfeature workpiece is contacted with an electroplating bath that is also in contact with an electrode. An electric potential is applied between the metal feature and the electrode which produces a first current density and causes deposition of a metal alloy having a first weight ratio of alloying metals onto the metal feature. In accordance with this method, the first current density is then adjusted to a second current density as the recessed feature is filled with metal alloy and deposition of metal alloy having a weight ratio of alloying metals that is substantially similar to the first weight ratio is continued.

Methods described herein can be carried out in a tool for forming a metal alloy feature that includes a reactor for receiving a microfeature workpiece that includes a metal feature within a recess. The reactor contains an electroplating bath that is in contact with an electrode. The reactor contacts the microfeature workpiece with the electroplating bath. The tool further includes a power source for applying a first electric potential, a second electric potential, and a third electric potential between the metal feature and the electrode. The first electric potential produces a first current density, which causes a metal alloy having a first weight ratio of alloying metals to be deposited within the recessed feature. The second electric potential produces a second current density, which causes a metal alloy having a second weight ratio of alloying metals to be deposited within the recessed feature. The third electric potential produces a third current density that causes a metal alloy having a third weight ratio of alloying metals to be deposited within the recessed feature.

Methods described herein further include methods of forming metal features wherein the deposition rate is increased for the metal feature. A method generally includes providing a microfeature workpiece that includes a metal feature within a recess, providing an electroplating bath in contact with an electrode, and contacting the microfeature workpiece with the electroplating bath. The method further includes applying an electric potential between the metal feature and the electrode and producing a first current density, and depositing metal within the recessed feature at a first deposition rate. The method further includes adjusting the electric potential to change the first current density to a second current density, and depositing metal within the recessed feature at a second deposition rate. The method further includes adjusting the electric potential to change the second current density to a third current density, depositing metal within the recessed feature at a third deposition rate. The metal feature may be a single metal feature or a metal alloy feature. In addition, the methods described herein further include controlling the metal deposition rate by adjusting the agitator speed as the metal is deposited, either alone or in combination with current density variation.

Methods described herein further include methods of forming metal alloy features by using reactor agitation speed to control metal alloy deposition. A method generally includes providing a microfeature workpiece that includes a metal feature within a recess, providing an electroplating bath in contact with an electrode, contacting the microfeature workpiece with the electroplating bath, and applying an electric potential between the metal feature and the electrode to produce a current density. The method further includes agitating the electroplating bath with an agitator at a first agitation speed, and depositing a metal alloy having a first weight ratio of alloying metals. The method further includes controlling the variation of the weight ratio of the alloying metals in the deposited metal alloy from the first weight ratio to a second weight ratio by adjusting the agitator to a second agitation speed as the metal alloy is deposited.

Methods described herein further include controlling the variation of the weight ratio of the alloying metals in the deposited metal alloy from the first weight ratio by adjusting at least one of the electric potential and the agitator to at least one of a second current density and a second agitation speed as the metal alloy is deposited. As described below in more detail, agitation speed adjustment can be applied alone or in combination with current density adjustments.

Methods described herein can be carried out in a tool for forming a metal feature that includes a reactor for receiving a microfeature workpiece that includes a metal feature within a recess. The tool includes an agitator for applying variable agitation speeds and a power source for applying variable current densities.

The methods and systems described herein include steps and components to control the composition, e.g., weight ratio of alloying metals in a deposited metal or metal alloy feature. The control provided by the methods and systems described herein will allow microelectronic device manufacturers to produce metal alloy features wherein variation of the metal alloy composition within the metal alloy feature is minimized or wherein variation of the metal alloy composition within the formed metal alloy feature is controlled to vary in a desired manner. In addition, methods described herein may further include applying a process control system to control the variation of the weight ratio of the alloying metals in the deposited metal alloy based on system parameters. The process control scheme may include any of a closed loop, a feedback loop, and a feed forward loop.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of the subject matter described herein will become more readily appreciated as the same become better understood by reference to the following detailed description, when taken in conjunction with the accompanying drawings, wherein.

DETAILED DESCRIPTION

While illustrative embodiments have been illustrated and described below, it will be appreciated that various changes can be made therein without departing from the spirit and scope of the subject matter described.

As used herein, the terms "microfeature workpiece" or "workpiece" refer to substrates on and/or in which micro devices are formed. Such substrates include semiconductive substrates (e.g., silicon wafers and gallium arsenide wafers), nonconductive substrates (e.g., ceramic or glass substrates), and conductive substrates (e.g., doped wafers). Examples of micro devices include microelectronic circuits or components, micromechanical devices, microelectromechanical devices, micro optics, thin film recording heads, data storage elements, microfluidic devices, and other small scale devices.

In the description that follows regarding forming a metal alloy feature on a microfeature workpiece, specific reference is made to an exemplary tin-silver solder system. The reference to deposition of a tin-silver solder is for exemplary purposes, and it should be understood that the methods and systems described herein are not limited to tin and silver ions.

As used herein, the term "substrate" refers to a base layer of material over which one or more metallization levels is disposed. The substrate may be, for example, a semiconductor, a ceramic, a dielectric, etc.

The formation of metal alloy features in accordance with processes described herein can be carried out in a tool designed to electrochemically deposit metals such as one available from Semitool, Inc., of Kalispell, Mont., under the trademark Raider™, as described in U.S. Pat. No. 7,198,694, and International Application Publication No. WO 04/108353, both entitled "Integrated tool with interchangeable wet processing components for processing microfeature workpieces and automated calibration systems," the disclosures of which are hereby incorporated by reference.

Figure 1:
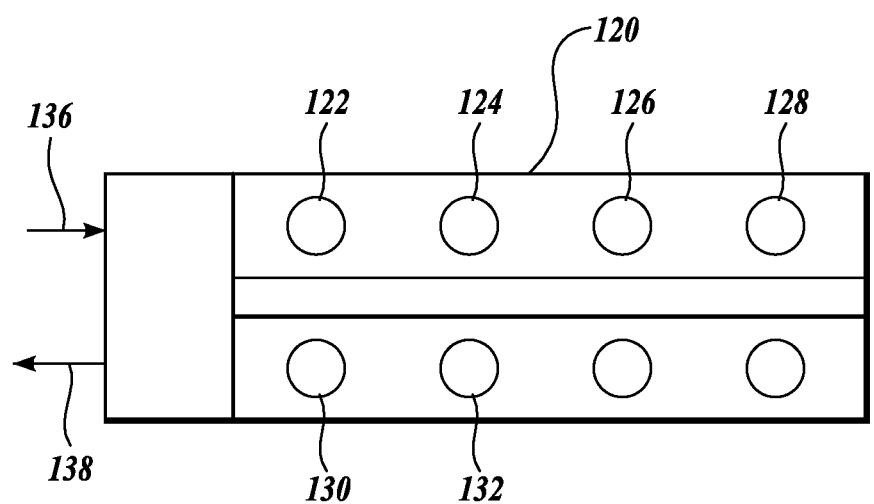
FIG. 1 is a schematic illustration of a tool for carrying out processes for forming metal alloy features described herein.

An integrated tool can be provided to carry out a number of process steps involved in the formation of microfeatures on microfeature workpieces. Below is described one possible combination of processing stations that could be embodied in a processing tool platform sold under the trademark Raider™ by Semitool, Inc. of Kalispell, Mont. It should be understood that other processing tool platforms could be configured in similar or different manners to carry out metallization steps such as those described below. Referring to FIG. 1, an exemplary integrated processing tool 120 includes stations to carry out a pre-wet step 122, optional copper deposition step 124, under bump metallization step 126, rinse step 128, alloy deposition step 130, and a spin-rinse-dry step 132. The chambers for carrying out such steps can be arranged in various configurations. Microelectronic workpieces are transferred between the chambers through the use of robotics (not shown). The robotics for the tool 120 are designed to move along a linear track. Alternatively, the robotics can be centrally mounted and designed to rotate to access the input section 136 and the output section 138 of tool 120. Suitable chambers for use in tool 120 include those available for the modular configuration of an Equinox® brand processing tool from Semitool, Inc. For example, one chamber useful for the alloy deposition step 130 is the Raptor™ reactor available from Semitool, Inc., as described in U.S. Patent Application Publication No. US2007/0151844 A1, and International Application Publication No. WO 07/062,114, both entitled "Apparatus and method for agitating liquids in wet chemical processing of microfeature workpieces," the disclosures of which are hereby incorporated by reference. Processing tool 120 is capable of being programmed to implement user entered processing recipes and conditions.

The pre-wet chamber 122, rinse chamber 128 and spin-rinse-dry chamber 132 can be of the type available from numerous manufacturers for carrying out such process steps. Examples of such chambers include spray processing modules and immersion processing modules available in conjunction with the Raider™ system described above. The optional copper deposition chamber 122, under bump metallization chamber 126 and metal alloy deposition chamber 130 can be provided by numerous electroplating and electroless deposition chambers such as those available as immersion processing modules and electroplating processing reactors for the Raider™ model ECD tool. Specific examples of an electroplating processing reactor include the types described in U.S. Patent Application Publication No. US2007/0151844 A1, entitled "Apparatus and method for agitating liquids in wet chemical processing of microfeature workpieces," and International Application Nos. WO 00/061498, WO 02/097165, WO 04/108353, WO 05/001896, WO 05/060379, and WO 07/062,114, the portions of the descriptions of these applications relating to the electroplating processing reactors are expressly incorporated herein by reference.

In general, a chamber for electroplating metal alloys includes a reactor, a bath supply, an electrode, e.g., an anode, a power supply, and a controller. The reactor receives the surface of the workpiece and exposes the surface to an electroplating bath. The bath supply includes a source of metal ion(s) to be deposited on the surface of the workpiece. The electrode is in electrical contact with the electroplating bath. The power supply supplies electroplating power between the surface of the workpiece and the electrode which promotes the electroplating of electroplate metal ions onto the surface. The controller controls the supply of electroplating power so that the metal ions are deposited on the workpiece surface.

Figure 2:
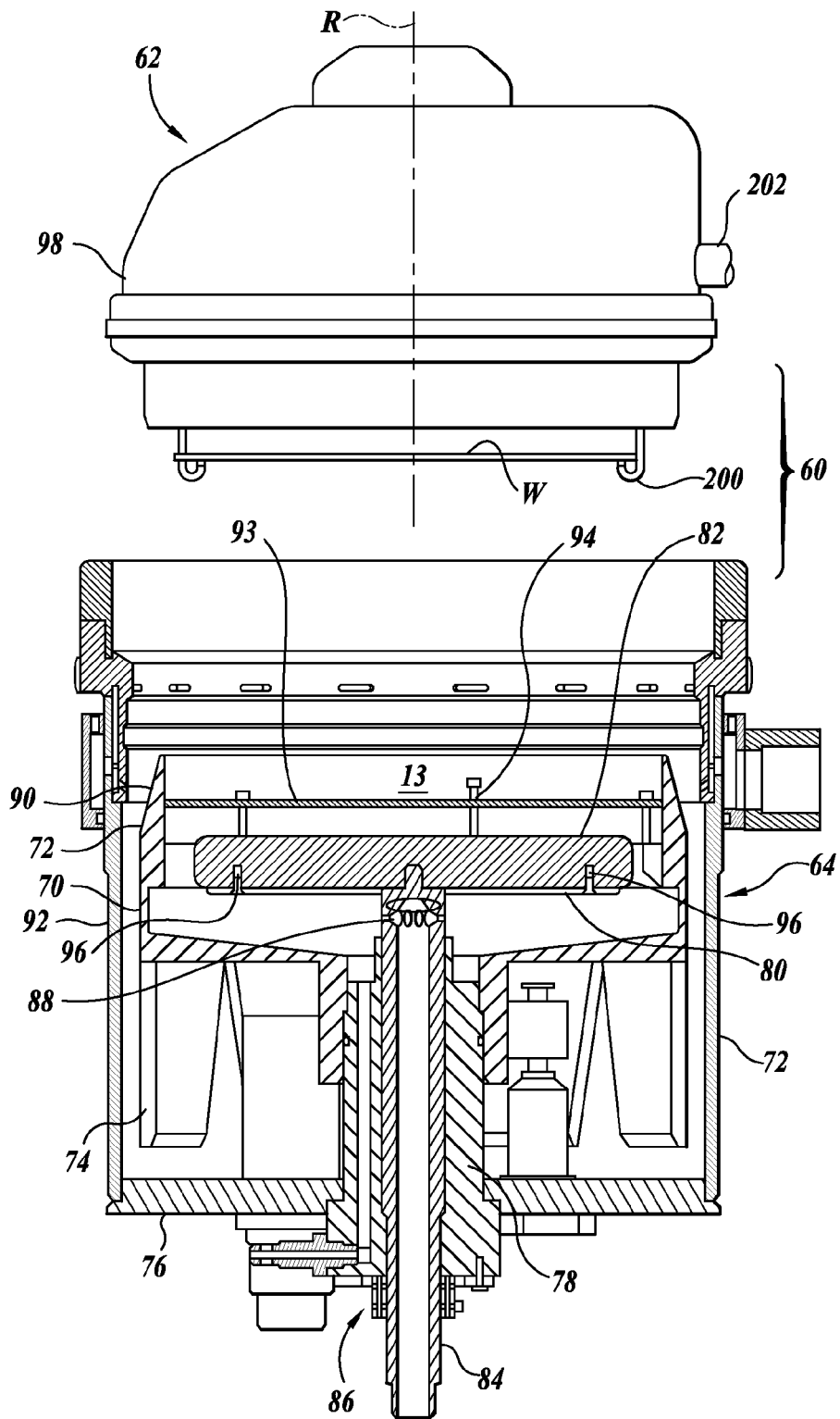
FIG. 2 is a schematic illustration of a reactor for carrying out methods described herein and for use in the tool described with reference to FIG. 1.

FIG. 2 illustrates a simplified form of a reactor 60. Reactor 60 includes a processing head 62 and an electroplating bowl assembly 64. The electroplating bowl assembly includes a cup assembly 70 that is disposed within a reservoir container 72. The cup assembly 70 includes a fluid reactor 72 portion that holds the electroplating bath fluid. The cup assembly also includes a depending annular skirt 74 which extends below the cup bottom 76, and which includes apertures opening therethrough for fluid communication of the plating bath solution, and for release of any gases that might collect as the reactor of the reservoir assembly is filled with plating solution. The cup is preferably made from a material that is inert to plating solutions, such as polypropylene.

A lower opening in the bottom wall of the cup assembly 70 is connected to a polypropylene (or other material) riser tube 78, which preferably is adjusted in height relative to the cup assembly by a threaded connection. A first end of the riser tube 78 is secured to the rear portion of an anode shield 80, which supports an anode 82. A fluid inlet line 84 is disposed within the riser tube 78. Both the riser tube 78 and the fluid inlet line 84 are secured to the processing bowl assembly 64 by a fitting 86. The fitting 86 can accommodate height adjustment of both the riser tube 78 and the inlet line 84. As such, this connection provides for vertical adjustment of the anode 82. The inlet line 84 is preferably made from a conductive material, such as titanium, and is used to conduct electrical current to the anode 82 from the power supply, as well as to supply fluid to the cup assembly 70.

The metal or metals to be plated onto the workpiece in accordance with the methods described herein are present in a plating solution as species of metal ions to be deposited onto the workpiece. Electroplating solution is provided to the cup assembly 70 through the fluid inlet line 84 and proceeds therefrom through a plurality of fluid inlet openings 88. The plating solution then fills the reactor 72 through openings 88, as supplied by a plating fluid pump (not shown) or other suitable supply. As described below in more detail, the metal ions are deposited under process conditions that preferentially deposit metal ions into recessed features as opposed to the surrounding field surfaces.

The upper edge of the cup sidewall 90 forms a weir, which limits the level of electroplating solution within the cup. This level is chosen so that only the bottom surface of a wafer W (or other workpiece) is contacted by the electroplating solution. Excess solution pours over this top edge into an overflow reactor 92.

The outflow liquid from the reactor 72 is preferably returned to a suitable reservoir where it can be treated with additional plating chemicals to adjust the levels of the constituents and then recycled through the plating reactor 72.

The anode 82 can be an inert anode used in connection with the plating of metals onto the workpiece. The specific anode may alternatively be a consumable anode, with the anode used in reactor 60 varying depending upon the specifics of the plating liquid and process being used.

The reactor illustrated in FIG. 2 also employs a diffuser element 93 that is disposed above the anode 82, providing an even distribution of the flow of fluid across the surface of wafer W. Fluid passages are provided over all or a portion of the diffuser plate 93, to allow fluid communication therethrough. The height of the diffuser element within the cup assembly may be adjustable by using a height adjustment mechanism 94.

The anode shield 80 is secured to the underside of the anode 82 using anode shield fasteners 96, to prevent direct impingement by the plating solution as the solution passes into the processing reactor 72. The anode shield 80 and anode shield fasteners 96 are preferably made from a dielectric material, such as polyvinylidene fluoride or polypropylene. The anode shield serves to electrically isolate and physically protect the backside of the anode.

The processing head 62 holds a wafer W (or other workpiece) within the upper region of the processing reactor 72. FIG. 2 illustrates in a simplified form that the head 62 is constructed to rotate the wafer W within the reactor 72 about an axis R. To this end, the processing head 62 includes a rotor assembly 98 having a plurality of wafer W engaging contacts 200 that hold the wafer W against features of the rotor. The rotor assembly 98 preferably includes a ring contact as described in International Application No. WO 00/40779, entitled "Method, chemistry, and apparatus for high deposition rate solder electroplating on a microelectronic workpiece," the disclosure of which is hereby incorporated by reference. The contacts 200 for a ring contact assembly are preferably adapted to conduct current between the wafer W and an electrical power supply.

The processing head 62 is supported by a head operator (not shown) that is adjustable to adjust the height of the processing head. The head operator also has a head connection shaft 202 that is operable to pivot about a horizontal pivot axis. Pivotal action of the processing head using the operator allows the processing head to be placed in an open or face-up position (not shown) for loading and unloading of the wafer W. FIG. 2 illustrates the processing head pivoted into a face-down position in preparation for processing.

Chambers useful for the optional copper deposition, under bump metallization, and metal alloy deposition may also include components to improve the mass transfer of metal ions into recessed features. Components for improving mass transfer of metal ions into recesses by reducing diffusion layer thicknesses include providing fluid jets to increase fluid flow velocities of the processing fluid at the surface of the workpiece to be treated, reciprocating elements to provide agitation and increase fluid flow, and components designed to form vortices adjacent the surface of the microfeature workpiece being treated.

The foregoing tools and chambers can be used to form metal alloys within recessed features using methods described below in more detail.

The following discussion references a specific alloy system tin-silver; however, it should be understood that the reference to tin-silver is for exemplary purposes and that the processes and systems described herein are also applicable to other metal alloy systems, such as lead alloy systems and noble metal alloy systems.

Figure 3A:
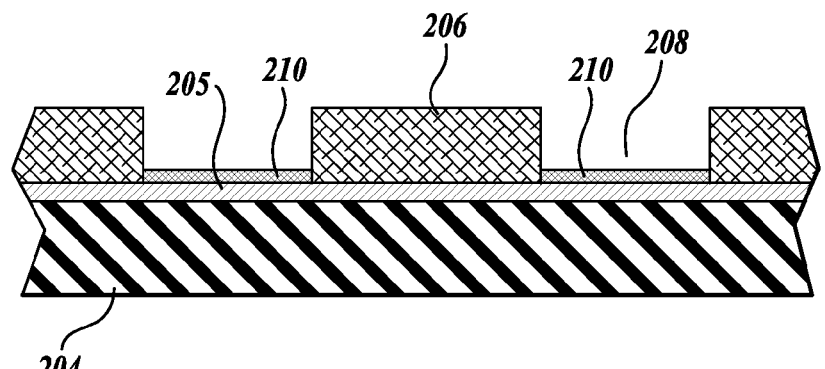
FIGS. 3A-3E schematically illustrate a sequence of steps corresponding to a method for depositing metal alloys described herein.
Figure 3B:
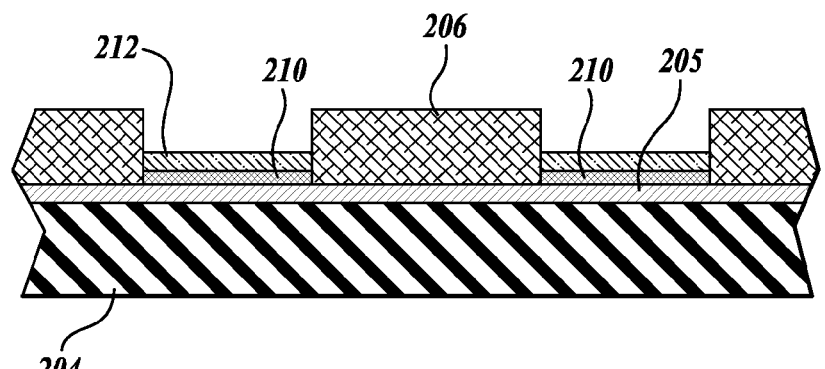
Figure 3C:
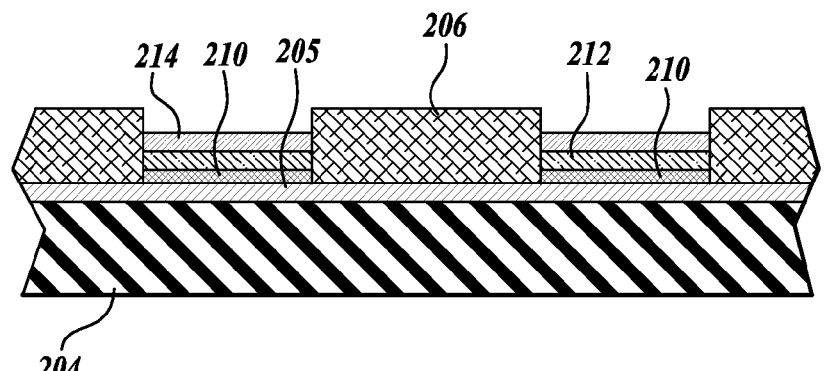
Figure 3D:
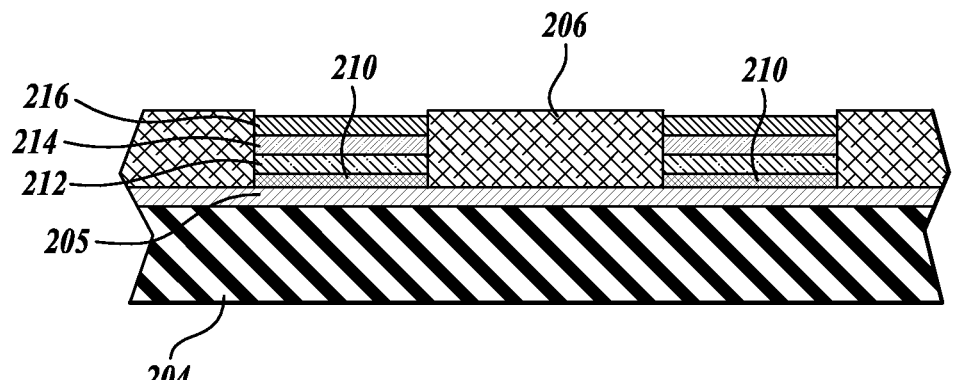

Referring to FIGS. 3A-3E, one method for forming a metal alloy feature is described with reference to a tin-silver solder alloy. Referring to FIG. 3A, substrate 204, e.g., a silicon wafer carries a dielectric layer 206 that has been patterned to provide recesses 208 within the dielectric material. Between the substrate 204 and the dielectric layer 206, the workpiece may include a continuous metal layer 205, such as a seed layer. Dielectric 206 can be patterned using conventional techniques such as photolithography. A metal feature 210 is formed within recess 208. Metal feature 210 can be formed using conventional techniques such as electrolytic, electroless, PVD, or CVD techniques.

In accordance with methods described herein, metal alloy features having a ratio of alloying metals within the feature that is relatively constant (or of minimal variance), e.g., from the bottom to the top of the feature, are provided by adjusting the current density and, accordingly, the deposition rate, as the recessed feature is filled. The manner in which the current density is adjusted and the timing of the adjustment in the current density will depend at least in part upon the specific chemistry employed as well as the cross section and depth dimensions of the recessed feature to be filled. In certain situations, it may be desirable to increase the deposition rate by increasing the current density as the recessed feature is filled. In other situations, it may be preferred to decrease the deposition rate by decreasing the current density as the recessed feature is filled.

Continuing to refer to FIGS. 3A-3E using methods described herein, a metal alloy feature is formed over metal feature 210 within recess 208. Processes described herein include steps that result in the formation of metal alloy features wherein the variation of the ratio of alloying metals within the formed metal alloy features is minimal. In other words, processes described herein produce metal alloy features wherein the weight ratio of alloying metals in the formed metal alloy features is relatively constant within the formed alloy feature, e.g., there is minimal variance in the weight ratio of alloying metals from the bottom to the top of the formed metal alloy feature. Acceptable variances in the weight ratio of alloying metals in the deposited feature will depend in part upon the composition of the alloy and the end use. For example, variations in alloying weight ratios acceptable for tin solder alloys may not be acceptable for Permalloy and other magnetic alloys. The ratio of alloying metals in a formed metal alloy feature is considered to be substantially constant when the variation in the ratio of alloying metals at locations within the formed metal alloy feature differs by less than about +/− 1 weight % from a target alloy composition for tin solder applications and less than about +/− 5 weight % from a target alloy composition for Permalloy and other magnetic alloy applications, an in a more preferable embodiment, +/−0.5 weight % from a target alloy composition for Permalloy and other magnetic alloy applications. Conversely, the ratio of alloying metals in formed metal alloy features is considered not to be substantially constant when the variation in the weight ratio of alloying metals at locations within the formed metal alloy feature falls outside these ranges for tin alloy solders, Permalloy and other magnetic alloy systems.

Using tools and reactors described above, substrate 204 is contacted with an electroplating bath that is also in contact with an electrode. Conventional electroplating baths available from numerous commercial sources can be employed. In accordance with processes described herein, the electric potential that is applied between the metal feature and the electrode is specifically adjusted during the course of the electroplating process as the recessed feature is filled and the feature formed. Increasing the electric potential increases the current density within the reaction chamber, which increases the deposition rate. Decreasing the electric potential decreases the current density within the reaction chamber, which decreases the deposition rate.

For near eutectic tin-silver alloy, silver has a higher reduction potential with significantly less amount of silver concentration than tin concentration in the plating solution. The present inventors predict that as the depth of a recessed feature decreases as a result of being filled by tin-silver alloy, mass transfer limitations on silver diminish and, accordingly, a greater amount of silver relative to the amount of tin is deposited into the recessed feature. In order to balance out the increased proportion of silver deposited into the recessed feature as it is filled and to continue to deposit an alloy of the same or similar composition, the current density can be increased, which results in an increase in the deposition rate of tin. In instances where it is desired to reduce variances in the weight ratio of tin and silver at different locations within the deposited metal alloy, the increase in current density is controlled such that the increased rate of tin deposition is proportional to the increased rate of silver deposition as the recessed feature is filled. The foregoing presumes that the current density is above the limiting current density of silver and, thus, an increase in current density has little impact on the deposition rate of silver. Controlling current density as described above provides a means for reducing and minimizing variances in the weight ratio of tin and silver within the deposited metal alloy. In some applications, it may be possible to reduce the variances to a point where the weight ratio of tin to silver is substantially the same throughout the entire deposited feature.

Figure 5:
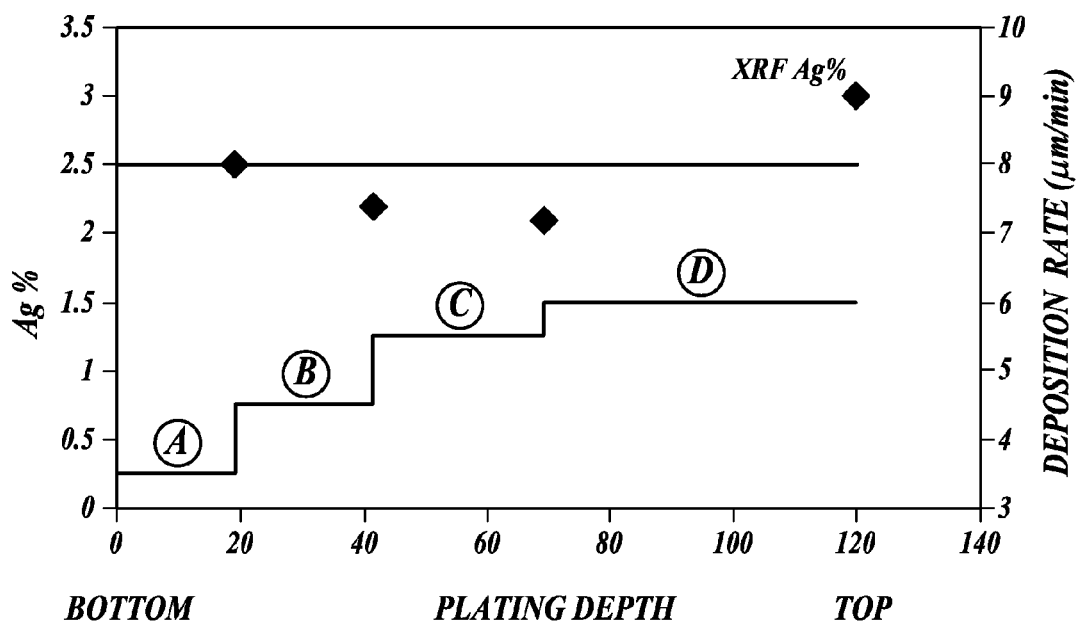
FIG. 5 graphically illustrates the silver content of a tin-silver alloy that is deposited within a recessed feature using a method described herein that employs four different plating rates Ⓐ-Ⓓ.

Referring to FIG. 5, an exemplary sequence for increasing deposition rates Ⓐ-Ⓓ as a recessed feature is filled is illustrated. The illustrated deposition rate increases can be achieved by adjusting the current density within a reaction chamber. The recessed feature being filled is a solder bump having a stud that is 108 microns in diameter with a total solder bump height of 120 microns. The sequence of deposition rate increases includes four step-ups that are instituted at different times as the recessed feature is filled. Table 1 below lists the thickness of the deposited metal alloy for the different deposition rates.

TABLE 1

| Step | Plating Depth (μm) | Deposition Rate (μm/min.) |
| --- | --- | --- |
| A | 0-20 | 3.5 |
| B | 20-40 | 4.5 |
| C | 40-70 | 5.5 |
| D | 70-120 | 6 |

The silver metal content of the deposited alloy feature just prior to the deposition rate increase was determined using x-ray fluorescence spectroscopy (XRF). These values are depicted in FIG. 5 as diamonds. XRF provides a meaningful measurement of the silver content of the metal alloy that is being deposited at the particular depth within the recessed feature indicated in FIG. 5. The measured values for silver content range between 2-3 weight %.

Referring back to FIGS. 3B-3E, during plating interval Ⓐ in FIG. 5, a layer of metal alloy 212 characterized by a first ratio of alloying metals is deposited over metal feature 210. Thereafter, the current density is increased to provide an increased deposition rate during interval Ⓑ that results in the deposition of metal alloy layer 214 characterized by a second ratio of alloying metals. Thereafter, during interval Ⓒ, a third layer 216 of metal alloy having a third ratio of alloying metals present is deposited. Thereafter, during interval Ⓓ, the balance of the stud portion and a mushroom portion 218 of the solder bump is deposited. Portion 218 is characterized by a fourth weight ratio of alloying metals.

Figure 3E:
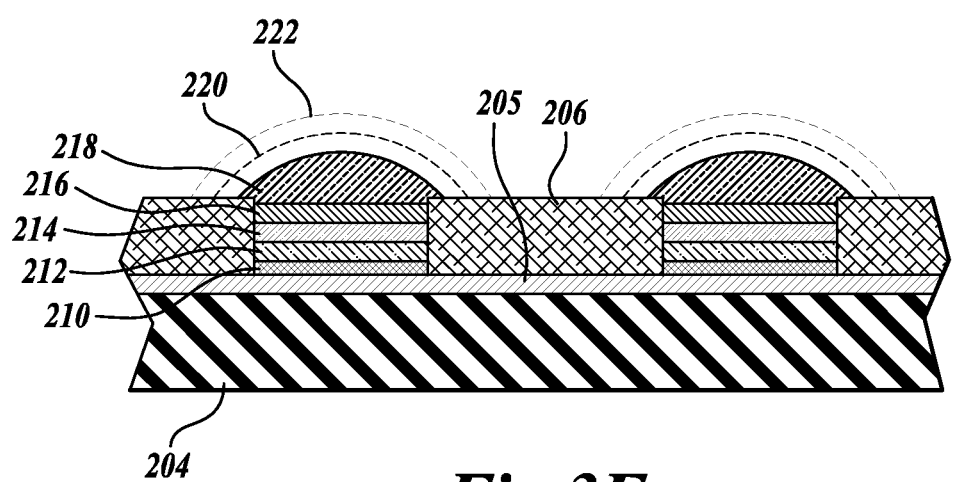
Figure 4:
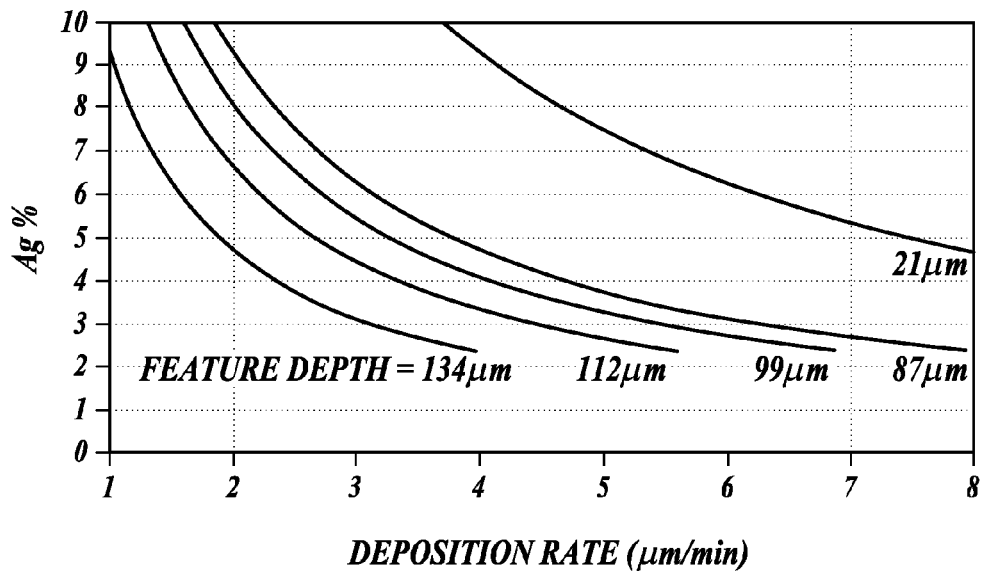
FIG. 4 is a graphical representation of a predicted relationship between the silver content of a tin-silver alloy and the deposition rate as a recessed feature is filled.

Continuing to refer to FIG. 3E, the mushroom portion of the solder bump may continue to grow as indicated by the broken lines 220 and 222. For the mushroom portion of the solder bumps, the mass transfer limits imposed by the requirements of depositing metal alloys into recessed features are less predominant; however, the concepts discussed herein for reducing the variance in composition of the deposited metal alloy features may also be applied to control the alloy composition of the mushroom portion of the solder bump. With the mushroom portion, it may be more desirable to decrease current density with increasing plateable area of the mushroom portion. Alternatively, formation of the mushroom portion of the solder bump could be carried out at as high a current density as possible in order to minimize the effect of the limiting current density of the more noble metal(s) used to form the metal alloy. Use of pulse conditions with an optimized duty cycle that provides an instantaneous current density that is elevated, may reduce the effect of the more noble metal limiting current density on the film composition.

As illustrated in FIG. 5 and noted above, the resulting solder bump includes four locations wherein the silver content of the solder bump ranges from 2% to 3%.

Figure 6:
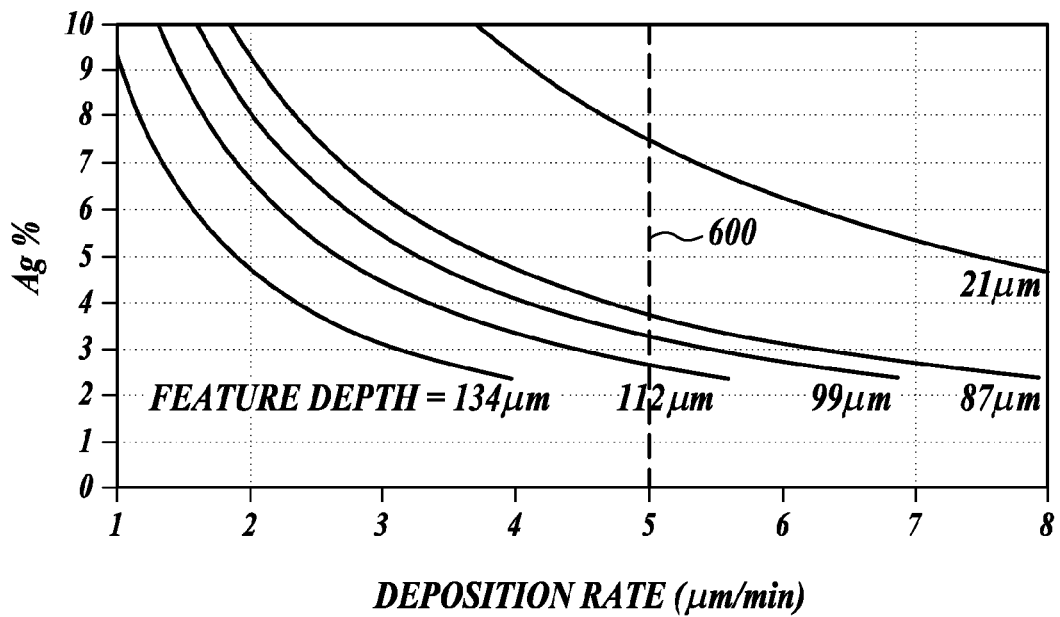
FIG. 6 graphically illustrates a predicted change in silver content as a recessed feature is filled at a constant deposition rate of 5 µm/min.
Figure 7:
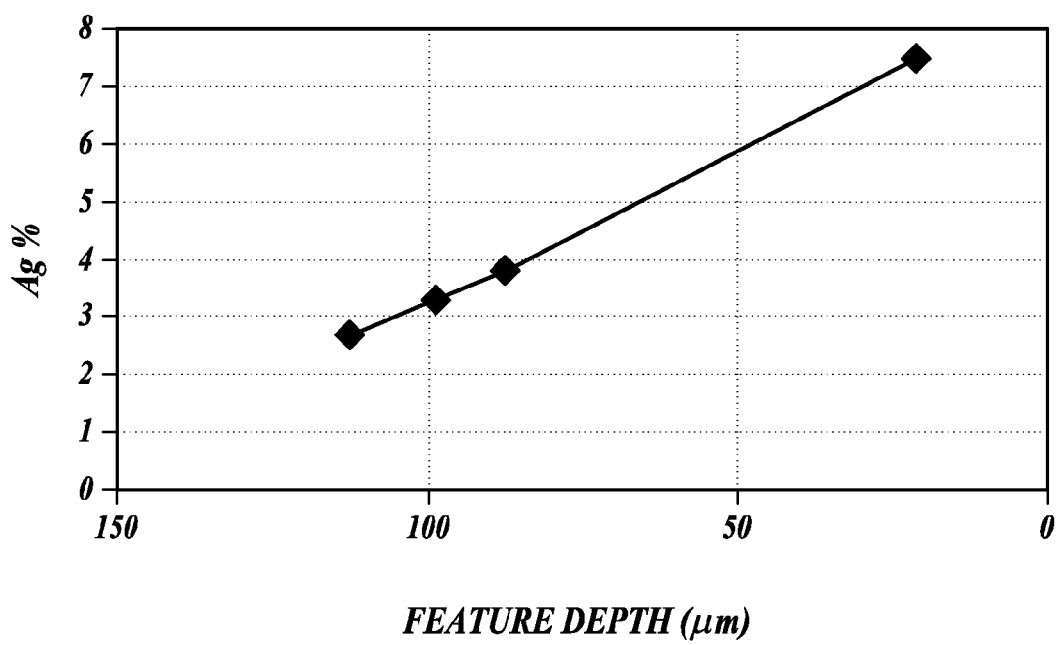
FIG. 7 graphically illustrates how the predicted silver content of a tin-silver alloy varies with the depth of the recessed feature when the deposition is carried out at a constant deposition rate of 5 µm/min. depicted in FIG. 5.

Referring to FIG. 6, the dotted line, shown as number 600, illustrates predicted silver content based on a constant deposition rate of 5 microns per minute. From FIG. 6, it can be seen that as the recessed feature fills, the percent silver content of the deposited tin-silver alloy increases. This increase is graphically illustrated more clearly in FIG. 7. FIG. 6 and FIG. 7 illustrate that if the deposition rate is held constant at 5 microns per minute, the predicted silver content for the deposited metal feature increases from about 2.7% near the bottom of the recessed feature to about 7.3% near the top of the solder bump.

The method described above with respect to FIGS. 3A-3E and FIG. 5 describes a four-step increase in the current density/deposition rate. An alternative to a step-wise increase in the current density/deposition rate would be a more continuous increase in the current density/deposition rate. For example, rather than the step-wise increase in deposition rate illustrated in FIG. 5, a curvilinear profile for the deposition rate increase could be employed. Using such a curvilinear continuous increase in the current density/deposition rate may minimize variations in the weight ratio of alloying metals within individual layers, e.g., within layer 212.

For some applications, it may be more desirable to deposit a metal alloy feature under conditions that are controlled to produce a desired variation in alloying metal weight ratio in the deposited feature as opposed to minimizing variation in alloying metal weight percent in the deposited feature. For example, there may be applications where it is preferred that the composition near the top of the deposited metal alloy feature varies significantly from the composition of the metal alloy near the bottom of the deposited feature. Such a feature can be produced using the method described below. A method for forming metal alloy features in recessed features that exhibit a controlled variance in weight ratio of alloying metals within the feature can be carried out in a manner similar to the method described above for producing metal alloy features wherein variance in the weight ratio of alloying metals in the formed feature is minimized. Unlike the processes described above for minimizing the variation in the weight ratio of alloying metals in the deposited feature, methods for controlling the weight ratio variance as opposed to minimizing the variance involve adjusting the current density/deposition rates so that the desired variable weight ratio of alloying metals is achieved.

Referring to FIG. 6, in one method a metal alloy feature can be formed wherein the weight ratio of alloying metals varies within the formed feature as depicted by dotted line 600 in FIG. 6. As noted above, dotted line 600 represents a process for forming a metal alloy feature that is carried out at a constant deposition rate of 5 microns per minute. When the deposition rate is held constant at 5 microns per minute, FIG. 6 predicts the silver content of the deposited alloy will increase as the recessed feature is filled. This variation in silver content of the deposited metal alloy feature is graphically illustrated in FIG. 7. Alternatively, rather than holding the current density/deposition rate constant, the current density and deposition rate can be varied in a manner that results in the ratio of alloying metals in the deposited metal feature varying to the desired degree.

In accordance with a second embodiment of the present disclosure, the alloy composition of the deposited metal layers can be controlled as the recessed feature fills by modifying the plating rate as a function of mass transfer controlled by a variable reactor agitation scheme, either alone or in suitable combination as a function of both agitation and current density. It should be appreciated that the methods described in accordance with the second embodiment are substantially similar to those described regarding the first embodiment, except for differences regarding variable reactor agitation schemes to control ion mass transfer to the recessed feature.

The plating scheme for reactor agitation variation is similar to the scheme described above regarding current density variation, and can also be described with reference to FIGS. 3B-3E. In that regard, as a non-limiting example of a method in accordance with this second embodiment, during a first plating interval, a first layer of metal alloy 212 characterized by a first ratio of alloying metals is deposited over metal feature 210. Thereafter, the agitation speed is changed to provide a second deposition rate during a second plating interval that results in the deposition of a second metal alloy layer 214 characterized by a second ratio of alloying metals. Thereafter, the agitation speed is again changed to provide a third deposition rate during a third plating interval, resulting in the deposition of a third layer 216 of metal alloy having a third ratio of alloying metals present is deposited. Thereafter, the agitation may again be changed during a fourth plating interval, during which the balance of the stud portion and a mushroom portion 218 of the solder bump is deposited. Portion 218 is characterized by a fourth weight ratio of alloying metals.

It should be appreciated that methods employing more or less than four plating intervals are within the scope of the present disclosure. In that regard, methods employing two, three, or four different plating intervals having different agitation speeds are within the scope of the present disclosure. It should further be appreciated that continuously changing plating methods are also within the scope of the present disclosure.

With respect to FIGS. 3A-3E, it should be appreciated by one having ordinary skill in the art that a continuous seed layer 205, under bump metallization, or barrier layer may be suitably disposed on the substrate 204 beneath metal feature 210.

In accordance with this second embodiment, the agitation speed can be either increased or decreased. In a preferable embodiment, decreasing the mass transfer of silver ions to the recess surface by decreasing the agitation speed in the reactor can be used to control metal alloy deposition composition to maintain a substantially constant metal alloy composition in the metal feature as the feature is deposited. It should be appreciated that agitation has a larger effect on mass transfer at a via aspect ratio of less than about 1 as compared to a via aspect ratio of greater than about 1. In accordance with other embodiments of the present disclosure, current density and agitation variation may be combined in any suitable variation scheme to achieve suitable deposition results. As a non-limiting example of a suitable combination, current density variation may be applied at a via aspect ratio of greater than about 1, and agitation variation may be applied at via aspect ratio of less than about 1.

Factors that affect the deposition of the components in a deposition alloy, such as a tin-silver alloy, include, but are not limited to, the following: the concentrations of metal ions in the bath, the temperature of the bath, agitation of the bath, the current density, the size of the recess opening, the depth of the recess that is being plated, the types and concentrations of bath additives (if any), and the mass transfer system being applied, for example, a very high mass transfer system, such as a Raptor™ reactor or a Magplus™ reactor (both available from Semitool, Inc.) versus a lower mass transfer system, such as a fountain plater. Both Raptor™ and Magplus™ reactors have the capability of applying variable agitation speeds. The Magplus™ reactor is described in U.S. Patent Application Publication No. US2004/0245094 A1, entitled "Integrated microfeature workpiece processing tools with registration systems for paddle reactors," the disclosure of which is hereby incorporated by reference.

The control scheme is therefore based on an understanding of how the mass transfer of the metal ions changes as a function of recess depth. Consider, as a non-limiting example, the deposition of tin and silver in a tin-silver metal alloy feature. As mentioned above, tin and silver have substantially different reduction potentials, respectively, −0.14 and +0.80 volts with respect to a standard hydrogen electrode. In addition, the silver concentration in a silver-tin electroplating bath is generally lower than the tin concentration. These factors can contribute to variations in the ratio of metals at different depths within the recess if adjustments are not made within the reactor.

Returning to FIGS. 3B-3E, as plating in the recessed feature 208 is carried out, the depth of the recess is reduced. This reduction in the depth of the recessed feature 208, in turn, increases the availability of silver ions at the bottom of the via 208 (i.e., the mass transfer of silver ions to the recess increases). Such a change in mass transfer may result in changes to the alloy composition of the deposited metal layers, i.e., an alloy composition having a higher weight percentage of silver with each subsequent deposited alloy layer.

In silver-tin alloy features with a proportionally lower amount of silver compared to tin, the amount of silver (the more noble of the two metals) to be deposited is generally limited by its limiting current density (which is the maximum deposition rate for silver that the process conditions can support). In accordance with conservation of charge principles, if the current density of the silver is substantially fixed at its limiting current density, the current density of the tin can be determined by calculating the difference between the applied current density and the limiting current density of the more noble metal, silver (assuming 100% process efficiency), i.e., the partial current density of the tin.

As metal is deposited in the bottom of the recess and the feature via becomes more shallow, the mass transport of silver ions to the metal feature increases, resulting in an increase in the limiting current density for silver. Without any modification of process variables (for example, without a change in current density or agitation speed), such an increase in mass transport of the silver ions results in a greater proportional deposition of silver with each subsequent metal layer. This increase in silver deposition can be controlled by increasing the current in the system as the supply of silver increases at the bottom of the via. If the total current density is sufficiently increased at each successive layer to ensure that the silver is at its mass transfer limit, the excessive current density (partial current) is allocated to the tin ions, and the proportion of tin deposited can be kept constant with each deposition layer. Likewise, if the agitation in the overall system (and thus the mass transfer at the top of the via) is decreased as the recess becomes more shallow, the mass transfer of the silver ions to the bottom of the shallower via can be maintained at a substantially constant rate, also resulting in substantially constant tin and silver compositions with each deposition layer.

As a non-limiting example, in one method of the present disclosure, current density and agitation variation may be combined by applying a pulsing current and agitation scheme. Specifically, current may be pulsed in an on/off scheme, with corresponding agitation pulses. In that regard, nonuniformities in ion consumption in the reactor or in reactor mass transfer refreshment may result in undesirable nonsymmetrical, dome-shaped, or crater-shaped features. Therefore, a pulsed current and agitation scheme may be used to control undesirable feature shapes. In that regard, when current is pulsed "off," agitation can be increased to refresh the ion concentration of the plating bath near and within the recess. When current is pulsed "on," agitation can be decreased so as not to result in non-uniform mass transfer of silver ions to the feature surface. In this scheme, ions are depleted uniformly above the plating surfaces and, as a result, these surfaces have more uniform growth and morphology.

It should be appreciated that the current pulses can be short pulses measured in milliseconds or longer pulsed measured in seconds. It should further be appreciated that the pulsing may be continuous, uniform on/off pulses, or may vary depending on recess depth. In addition, it should further be appreciated that other agitation scheme variations are within the scope of the present disclosure, for example, decreased agitation during the "off" pulse and increased agitation during the "on" pulse.

It should be appreciated that variable agitation and current density schemes can be applied either in stepwise or continuous schemes to control the deposition of silver and tin, i.e., to maintain substantially the same or substantially similar deposition patterns for silver and tin as the metal feature grows. As a non-limiting example, a graphical illustration of deposition rate versus via depth for silver deposition at a constant 3% silver content can be seen in FIG. 8. This graph plots points for two systems, one system plating a 108 μm diameter feature and the other plating a 85 μm feature. In this example, the reactor agitation is run at a constant rate of 200 mm/s, with a bath comprising 80 g/liter tin and 2 g/liter silver.

Figure 8:
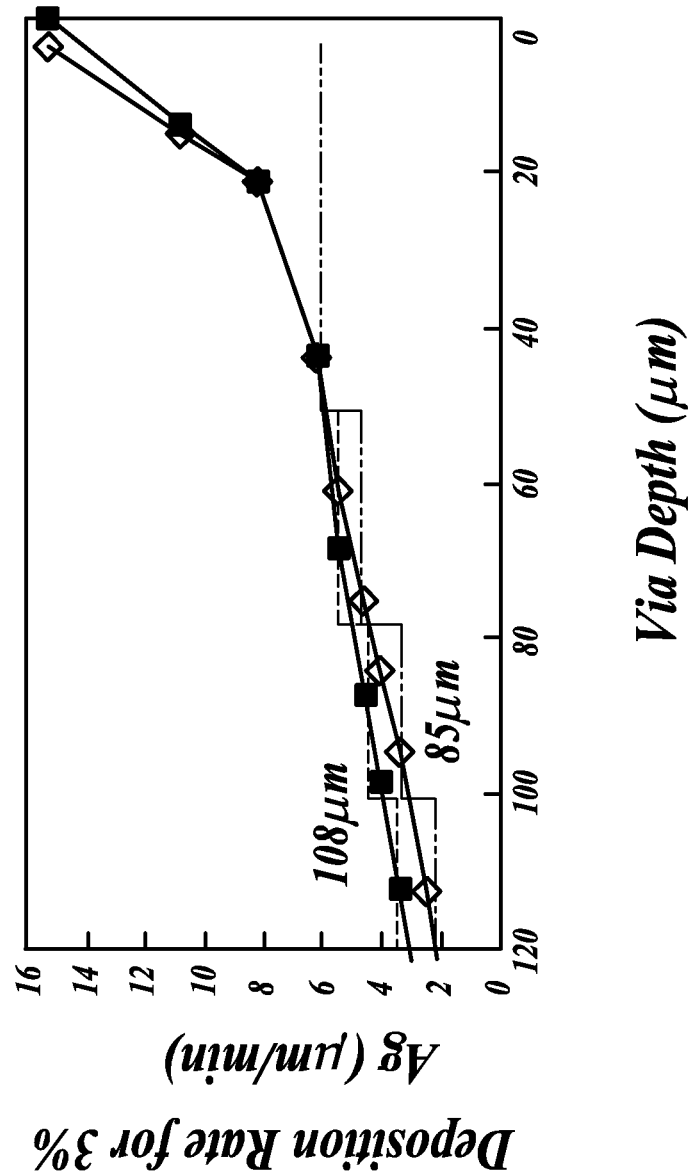
FIG. 8 graphically illustrates deposition rates versus via depths for silver deposition at a constant 3% silver content in two different diameter features.

It should be appreciated that a suitable curve fit to the data shown in FIG. 8 would depict a continuous scheme for current density increases that result in a substantially constant silver content. In addition, suitable steps (as shown in phantom) depict an exemplary stepwise scheme for current density increases that result in a substantially constant silver content. It should also be appreciated that suitable steps or a suitable curve fit may be represented as a function of time, as opposed to via depth.

In accordance with a third embodiment of the present disclosure, the metal composition is not a metal alloy, but is a single metal deposition that can be controlled as the recessed feature fills by modifying the plating rate as a function of mass transfer controlled by variable agitation or current density, either alone or in any suitable combination. It should be appreciated that the methods described in accordance with the third embodiment are substantially similar to those described regarding the first and second embodiments, except for differences regarding the metal composition of the metal feature.

In accordance with the embodiments described above, suitable metal alloys and metal alloy solders include, but are not limited to, noble metal alloys, tin-copper, tin-silver-copper, tin-bismuth, Permalloy and other nickel alloys, lead-tin alloys, and other lead-free alloys. In forming metal features, as opposed to metal alloy features, suitable metals include, but are not limited to, copper, tin, gold, nickel, silver, palladium, platinum, and rhodium.

Although there is no composition variation in a single metal feature, there are other advantages to applying the methods described herein to process for plating single metal features. In that regard, changes to current density and reactor agitation schemes can result in increased through-put for reactors and improved feature morphology, both achieved by increasing deposition rates and improving mass transfer conditions as the feature fills. In addition, if bath additives are used in the process, changes to current density and reactor agitation schemes can also aid in the control of the concentration and mass transfer of additives to the plating surfaces.

Like the other embodiments, the plating scheme for a single metal feature can also be described with reference to FIGS. 3B-3E. In that regard, as a non-limiting example of a method in accordance with embodiments of the present disclosure, during a first plating interval, a first layer of metal 212 characterized by a first deposition rate is deposited over metal feature 210. Thereafter, the current density is increased to provide a second deposition rate during a second plating interval that results in the deposition of a second metal layer 214 characterized by a second deposition rate of the metal. Thereafter, current density is again increased to provide a third deposition rate during a third plating interval, resulting in the deposition of a third metal layer 216 having a third deposition rate. Thereafter, the current density may again be changed during a fourth plating interval, during which the balance of the stud portion and a mushroom portion 218 of the bump is deposited. Portion 218 is characterized by a fourth deposition rate of the metal.

As described above with reference to the second embodiment, it should be appreciated that methods employing more or less than four plating intervals having different current densities and/or agitation speeds are within the scope of the present disclosure. In that regard, methods employing two, three, or four different plating intervals having different current densities and/or agitation speeds are within the scope of the present disclosure. In accordance with other embodiments of the present disclosure, suitable control schemes may be employed to adjust the parameters of the system for optimal metal deposition. In that regard, in one embodiment of the present disclosure, the method may include measuring the composition in situ to adjust the parameters of the system and control the deposition composition in a closed loop control scheme. In another embodiment of the present disclosure, the method may include measuring the composition ex situ to adjust the parameters of the system and control the deposition composition in a feed-back loop or a feed-forward loop. For example, referring to FIGS. 5 and 6, silver deposition can be calculated based on feature depth and current density measurements within the system.

The embodiments of the invention in which an exclusive property or privilege is claimed are defined as follows:

1. A method of forming a metal feature by plating through a patterned dielectric layer in an electroplating bath, the method comprising:
    providing a microfeature workpiece that includes a substrate having a continuous metal seed layer disposed on the substrate and a dielectric layer patterned on the metal seed layer to provide a recess defining sidewall surfaces and a bottom surface, wherein the bottom surface of the recess is a metal surface and the sidewall surfaces of the recess are dielectric surfaces;
    providing an electroplating bath in contact with an electrode;
    contacting the microfeature workpiece with the electroplating bath;
    applying an electric potential between the metal seed layer and the electrode and producing a first current density;
    electrochemically depositing a first metal layer within the recessed feature on an exposed top surface of the metal seed layer at a first deposition rate in the same electroplating bath;
    adjusting the electric potential to change the first current density to a second current density, wherein the second current density is increased from the first current density in the electroplating bath;
    electrochemically depositing a second metal layer within the same recessed feature on the exposed top surface of the first metal layer at a second deposition rate in the same electroplating bath, wherein the second deposition rate is greater than the first deposition rate;
    adjusting the electric potential to change the second current density to a third current density, wherein the third current density is increased from the second current density in the electroplating bath; and
    electrochemically depositing a third metal layer within the same recessed feature on the exposed top surface of the second metal layer at a third deposition rate in the same electroplating bath, wherein the third deposition rate is greater than the second deposition rate, wherein the first metal layer is deposited to a first depth, the second metal layer is deposited to a second depth, and the third metal layer is deposited to a third depth, wherein the first, second, and third current densities achieve an increasing deposition rate at the first, second, and third depths, wherein the metal in the metal layers is a metal alloy, wherein the first, second, and third current densities achieve a substantially constant weight ratio of alloying metals in the first, second, and third metal layers, and wherein the depth of the recess is in the range of about 21 microns to 134 microns.

2. The method of claim 1, further comprising adjusting the electric potential to change the third current density to a fourth current density and depositing metal within the recessed feature at a fourth deposition rate.

3. The method of claim 2, wherein the fourth deposition rate is greater than the third deposition rate.

4. The method of claim 1, wherein the metal in the metal layers is a metal alloy, selected from the group consisting of noble metal alloys, lead-free alloys, Permalloy, nickel alloys, tin-copper, tin-silver-copper, and tin-bismuth.

5. The method of claim 1, further comprising agitating the electroplating bath with an agitator at a first agitation speed.

6. The method of claim 5, further comprising adjusting the agitator from the first agitation speed to a second agitation speed as the metal is deposited.

7. The method of claim 6, wherein the second agitation speed is less than the first agitation speed.

8. The method of claim 6, further comprising adjusting the agitator from the second agitation speed to a third agitation speed as the metal is deposited.

9. The method of claim 8, wherein the third agitation speed is less than the second agitation speed.

10. A method of forming a metal alloy feature by plating through a patterned dielectric layer in an electroplating bath, the method comprising:
    providing a microfeature workpiece that includes a substrate having a continuous metal seed layer disposed on the substrate and a dielectric layer patterned on the metal seed layer to provide a recess defining sidewall surfaces and a bottom surface, wherein the bottom surface of the recess is a metal surface and the sidewall surfaces of the recess are dielectric surfaces;
    providing an electroplating bath in contact with an electrode;
    contacting the microfeature workpiece with the electroplating bath;
    applying an electric potential between the metal seed layer and the electrode to produce a first current density in the electroplating bath;
    agitating the electroplating bath with an agitator at a first agitation speed in the electroplating bath;
    electrochemically depositing a metal alloy having a first weight ratio of alloying metals on the exposed top surface of the metal seed layer in the recess in the electroplating bath; and
    controlling the variation of the weight ratio of the alloying metals in the deposited metal alloy from the first weight ratio by adjusting at least one of the electric potential and the agitator to at least one of a second current density and a second agitation speed as the metal alloy is deposited in the electroplating bath to deposit a metal alloy having a second weight ratio of alloying metals in the electroplating bath, wherein the second current density is greater than the first current density or the second agitation speed is less than the first agitation speed and wherein the weight ratio of alloying metals in the first weight ratio and the second weight ratio are substantially the same, wherein the depth of the recess is in the range of about 21 microns to 134 microns.

11. The method of claim 10, further comprising controlling the variation of the weight ratio of the alloying metals in the deposited metal alloy from the second weight ratio to a third weight ratio by adjusting the agitator to a third agitation speed as the metal alloy is deposited.

12. The method of claim 11, wherein the third agitation speed is less than the second agitation speed.

13. The method of claim 11, wherein the weight ratio of alloying metals in the second weight ratio and the third weight ratio are substantially the same.

14. The method of claim 11, further comprising controlling the variation of the weight ratio of the alloying metals in the deposited metal alloy from the third weight ratio to a fourth weight ratio by adjusting the agitator to a fourth agitation speed as the metal alloy is deposited.

15. The method of claim 14, wherein the fourth agitation speed is less than the third agitation speed.

16. The method of claim 14, wherein the weight ratio of alloying metals in the third weight ratio and the fourth weight ratio are substantially the same.

17. The method of claim 10, further comprising continually adjusting the agitation speed from the second agitation speed as the recessed feature is filled.

18. The method of claim 10, further comprising applying a process control system to control the variation of the weight ratio of the alloying metals in the deposited metal alloy based on system parameters, wherein the process control scheme is selected from the group consisting of a closed loop, a feedback loop, and a feed forward loop.

19. The method of claim 10, further comprising adjusting both of the electric potential and the agitator to at least a second current density and a second agitation speed as the metal alloy is deposited.

20. The method of claim 10, further comprising applying the electric potential between the metal seed layer and the electrode in an on/off pulse scheme.

21. A method of forming a metal feature by plating through a patterned dielectric layer in an electroplating bath, the method comprising:
providing a microfeature workpiece that includes a substrate having a continuous metal seed layer disposed on the substrate and a dielectric layer patterned on the metal seed layer to provide a recess defining sidewall surfaces and a bottom surface, wherein the bottom surface of the recess is a metal surface and the sidewall surfaces of the recess are dielectric surfaces, and wherein the depth of the recess is in the range of about 21 microns to about 134 microns;
providing an electroplating bath in contact with an electrode;
contacting the microfeature workpiece with the electroplating bath;
applying an electric potential between the metal seed layer and the electrode and producing a first current density in the electroplating bath;
agitating the electroplating bath with an agitator at a first agitation speed in the electroplating bath;
electrochemically depositing a first metal layer on the exposed top surface of the metal seed layer in the recess in the electroplating bath;
adjusting the electric potential and the agitator to a second current density and a second agitation speed as the metal is deposited to electrochemically deposit a second metal layer on the exposed top surface of the first metal layer in the recess in the same electroplating bath, wherein the second current density is increased from the first current density and the second agitation speed is less than the first agitation speed; and
adjusting at least one of the electric potential and the agitator to at least one of a third current density and a third agitation speed as the metal is deposited to electrochemically deposit a third metal layer on the exposed top surface of the second metal layer in the recess in the same electroplating bath, wherein the third current density is increased from the second current density and the third agitation speed is less than the second agitation speed, wherein the metal in the metal layers is a metal alloy, and wherein the first metal layer is deposited to a first depth, the second metal layer is deposited to a second depth, and the third metal layer is deposited to a third depth, wherein the first, second, and third current densities or the first, second, and third agitation rates achieve a substantially constant weight ratio of the alloying metals in the first, second, and third metal layers.

22. The method of claim 21, wherein the metal in the metal layers is selected from the group consisting of copper, tin, gold, nickel, silver, palladium, platinum, and rhodium.

23. The method of claim 21, wherein the metal in the metal layers is a metal alloy.

24. The method of claim 21, wherein the electric potential is applied in an on/off pulse scheme.

25. The method of claim 21, wherein the second agitation speed is less than the first agitation speed.

26. The method of claim 21, further comprising applying the electric potential between the metal seed layer and the electrode in a repeating on/off pulse scheme, wherein the first agitation speed overlaps at least in part with the current "on" pulse and the second agitation speed overlaps at least in part with the current "off" pulse.

27. The method of claim 10, further comprising adjusting at least one of the electric potential and the agitator to at least one of the second current density and the second agitation speed in a continuous scheme as the metal alloy is deposited.

28. The method of claim 21, further comprising adjusting at least one of the electric potential and the agitator to at least one of the second current density and the second agitation speed in a continuous scheme as the metal is deposited.

29. A method of forming a metal feature by plating through a patterned dielectric layer in an electroplating bath, the method comprising:
providing a microfeature workpiece that includes a substrate having a continuous metal seed layer disposed on the substrate and a dielectric layer patterned on the metal seed layer to provide a recess defining sidewall surfaces and a bottom surface, wherein the bottom surface of the recess is a metal surface and the sidewall surfaces of the recess are dielectric surfaces, and wherein the depth of the recess is in the range of about 21 microns to about 134 microns;
providing an electroplating bath in contact with an electrode;
contacting the microfeature workpiece with the electroplating bath;
applying an electric potential between the metal seed layer and the electrode and producing a first current density in the electroplating bath;
agitating the electroplating bath with an agitator at a first agitation speed in the electroplating bath;
electrochemically depositing a first metal layer on the exposed top surface of the metal seed layer in the recess in the electroplating bath; and
adjusting the electric potential and the agitator to a second current density and a second agitation speed as the metal is deposited to electrochemically deposit a second metal layer on the exposed top surface of the first metal layer in the recess in the same electroplating bath, wherein the first agitation speed correlates at least in part with the first current density and the second agitation speed correlates at least in part with the second current density and wherein the second current density is increased from the first current density and the second agitation speed is less than the first agitation speed.

30. The method of claim 29, further comprising applying the electric potential between the metal seed layer and the electrode in a repeating on/off pulse scheme.

31. The method of claim 29, further comprising applying the agitation speed in a repeating pulse scheme.

32. The method of claim 29, further comprising adjusting the electric potential and the agitator from the first current density to the second current density and from the first agitation speed to the second agitation speed in a continuous scheme as the metal is deposited.

33. The method of claim 29, wherein the metal in the metal layers is a metal alloy.

34. The method of claim 1, wherein the first metal layer is deposited to a first depth, the second metal layer is deposited to a second depth, and the third metal layer is deposited to a third depth, wherein the first, second, and third current densities achieve a continuously increasing deposition rate at the first, second, and third depths.

35. The method of claim 1, wherein the electric potential is applied in an on/off pulse scheme such that the first current density correlates to a current "on" pulse and the second current density correlates to a current "off" pulse.

36. The method of claim 35, further comprising agitating the electroplating bath with an agitator at a first agitation speed and adjusting the agitator from a first agitation speed to a second agitation speed as the metal is deposited, wherein the first agitation speed correlates to the current "on" pulse and the second agitation speed correlates to the current "off" pulse.

37. The method of claim 36, further comprising applying the electric potential between the metal seed layer and the electrode in a repeating on/off pulse scheme, wherein the first agitation speed overlaps at least in part with the current "on" pulse and the second agitation speed overlaps at least in part with the current "off" pulse.

38. The method of claim 21, wherein the first metal layer is deposited to a first depth, the second metal layer is deposited to a second depth, and the third metal layer is deposited to a third depth, wherein the first, second, and third current densities achieve increasing deposition rates at the first, second, and third depths.

39. The method of claim 29, wherein the first metal layer is deposited to a first depth and the second metal layer is deposited to a second depth, wherein the first and second current densities achieve increasing deposition rates at the first and second depths.

40. The method of claim 1, wherein current density varies inversely with the depth of the recess.

41. The method of claim 1, wherein the metal in the metal layers is a tin-silver alloy.

42. The method of claim 41, wherein current density is increased at each successive metal layer such that the tin-silver weight ratio is substantially the same at each metal layer.

43. The method of claim 10, wherein current density varies inversely with the depth of the recess.

44. The method of claim 1, wherein the metal alloy in the metal layers is a tin-silver alloy.

45. The method of claim 44, wherein current density is increased at each successive metal layer such that the tin-silver weight ratio is substantially the same at each metal.

46. A method of forming a metal feature by plating through a patterned dielectric layer in an electroplating bath, the method comprising:
providing a microfeature workpiece that includes a substrate having a continuous metal seed layer disposed on the substrate and a dielectric layer patterned on the metal seed layer to provide a recess defining sidewall surfaces and a bottom surface, wherein the bottom surface of the recess is a metal surface and the sidewall surfaces of the recess are dielectric surfaces;
providing an electroplating bath in contact with an electrode;
contacting the microfeature workpiece with the electroplating bath;
applying an electric potential between the metal seed layer and the electrode and producing a first current density;
electrochemically depositing a first metal layer within the recessed feature on an exposed top surface of the metal seed layer at a first deposition rate in the same electroplating bath;
adjusting the electric potential to change the first current density to a second current density, wherein the second current density is increased from the first current density in the electroplating bath;
electrochemically depositing a second metal layer within the same recessed feature on the exposed top surface of the first metal layer at a second deposition rate in the same electroplating bath, wherein the second deposition rate is greater than the first deposition rate;
adjusting the electric potential to change the second current density to a third current density, wherein the third current density is increased from the second current density in the electroplating bath; and
electrochemically depositing a third metal layer within the same recessed feature on the exposed top surface of the second metal layer at a third deposition rate in the same electroplating bath, wherein the third deposition rate is greater than the second deposition rate, wherein the first metal layer is deposited to a first depth, the second metal layer is deposited to a second depth, and the third metal layer is deposited to a third depth, wherein the first, second, and third current densities achieve an increasing deposition rate at the first, second, and third depths, wherein the metal in the first, second, and third metal layers is a tin-silver alloy, and wherein the second and third current densities are increased at each successive metal layer such that the tin-silver weight ratio is substantially the same at each metal layer.

* * * * *